(12) United States Patent
Yeh et al.

(10) Patent No.: US 10,727,147 B2
(45) Date of Patent: Jul. 28, 2020

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Shu-Shen Yeh, Taoyuan (TW); Po-Yao Lin, Zhudong Township (TW); Shyue-Ter Leu, Hsinchu (TW); Shin-Puu Jeng, Hsinchu (TW); Chih-Kung Huang, Hsinchu (TW); Tsung-Ming Yeh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/166,625

(22) Filed: Oct. 22, 2018

(65) Prior Publication Data

US 2019/0057916 A1  Feb. 21, 2019

Related U.S. Application Data

(62) Division of application No. 15/073,254, filed on Mar. 17, 2016, now Pat. No. 10,109,547.

(Continued)

(51) Int. Cl.
*H01L 23/34* (2006.01)
*H01L 23/31* (2006.01)
*H01L 23/04* (2006.01)
*H01L 23/367* (2006.01)
*H01L 21/56* (2006.01)
(Continued)

(52) U.S. Cl.
CPC ........ *H01L 23/315* (2013.01); *H01L 21/4817* (2013.01); *H01L 21/4871* (2013.01); *H01L 21/56* (2013.01); *H01L 21/565* (2013.01); *H01L 23/04* (2013.01); *H01L 23/3128* (2013.01); *H01L 23/3142* (2013.01); *H01L 23/367* (2013.01); *H01L 24/16* (2013.01); *H01L 24/32* (2013.01); *H01L 24/73* (2013.01); *H01L 24/92* (2013.01); *H01L 25/18* (2013.01); *H01L 2224/16145* (2013.01); *H01L 2224/16227* (2013.01); *H01L 2224/32245* (2013.01); *H01L 2224/73253* (2013.01); *H01L 2224/92225* (2013.01); *H01L 2225/06513* (2013.01); *H01L 2225/06568* (2013.01); *H01L 2225/06589* (2013.01); *H01L 2924/141* (2013.01); *H01L 2924/143* (2013.01); *H01L 2924/1431* (2013.01); *H01L 2924/1434* (2013.01); *H01L 2924/157* (2013.01); *H01L 2924/1815* (2013.01); *H01L 2924/18161* (2013.01); *H01L 2924/3511* (2013.01); *H01L 2924/37001* (2013.01)

(58) Field of Classification Search
CPC . H01L 21/4817; H01L 21/4871; H01L 21/56; H01L 21/565; H01L 23/04
USPC .................................... 257/704, 713
See application file for complete search history.

(56) References Cited

U.S. PATENT DOCUMENTS 5,450,283 A  9/1995 Lin et al.
5,471,366 A  11/1995 Ozawa
(Continued)

*Primary Examiner* — Nitin Parekh
(74) *Attorney, Agent, or Firm* — Slater Matsil, LLP

(57) ABSTRACT

A device includes a substrate with a die over the substrate. A molding compound surrounds the die and includes a structural interface formed along a peripheral region of the molding compound.

20 Claims, 4 Drawing Sheets

Related U.S. Application Data

(60) Provisional application No. 62/288,592, filed on Jan. 29, 2016.

(51) Int. Cl.
*H01L 21/48* (2006.01)
*H01L 23/00* (2006.01)
*H01L 25/18* (2006.01)

(56) References Cited

U.S. PATENT DOCUMENTS

| | | |
|---|---|---|
| 5,726,079 A | 3/1998 | Johnson |
| 5,773,886 A | 6/1998 | Rostoker et al. |
| 5,969,947 A | 10/1999 | Johnson et al. |
| 6,458,626 B1 | 10/2002 | Huang et al. |
| 6,933,619 B2 | 8/2005 | Caletka et al. |
| 8,710,640 B2 * | 4/2014 | Choi ............ H01L 23/36 257/686 |
| 8,912,051 B1 * | 12/2014 | Syed ............ H01L 21/565 257/787 |
| 10,163,754 B2 * | 12/2018 | Ho ............ H01L 21/4803 |
| 2002/0017738 A1 | 2/2002 | Miyajima |
| 2003/0168749 A1 * | 9/2003 | Koike ............ H01L 21/563 257/791 |
| 2005/0095875 A1 | 5/2005 | Huang et al. |
| 2009/0096115 A1 | 4/2009 | Huang et al. |
| 2010/0096747 A1 | 4/2010 | Kusano |
| 2014/0168902 A1 | 6/2014 | Park et al. |
| 2014/0264815 A1 * | 9/2014 | Yew ............ H01L 23/04 257/704 |
| 2015/0221625 A1 | 8/2015 | Chun et al. |
| 2015/0348928 A1 | 12/2015 | Co et al. |
| 2016/0035637 A1 * | 2/2016 | Urago ............ H01L 23/49838 257/693 |
| 2016/0276308 A1 | 9/2016 | Min et al. |

* cited by examiner

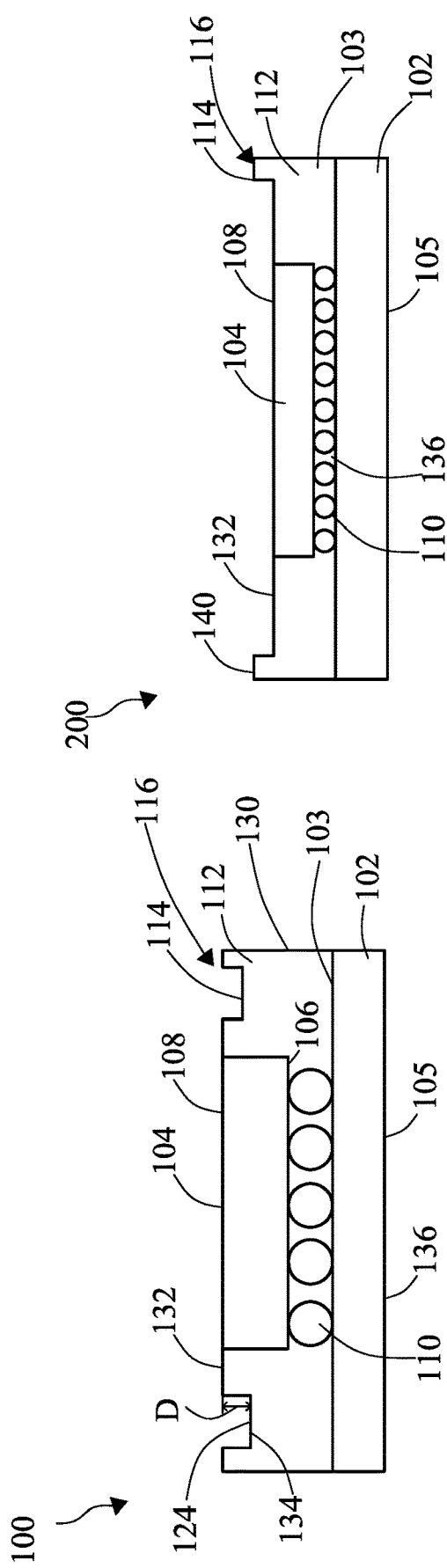
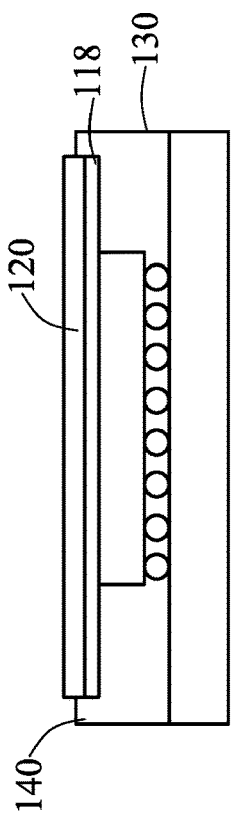
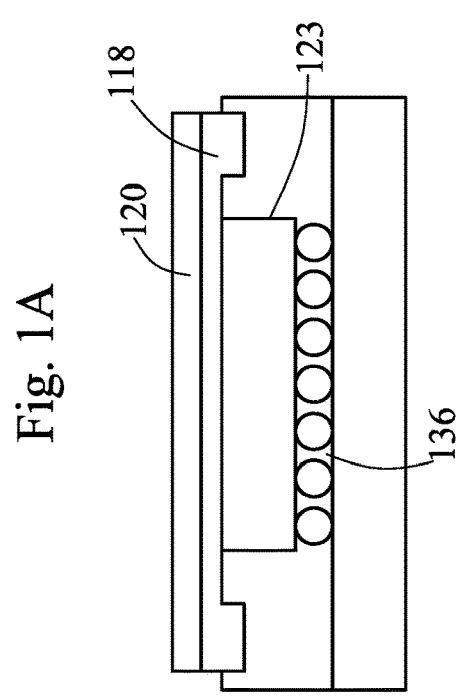
Fig. 1A
Fig. 1B
Fig. 2A
Fig. 2B

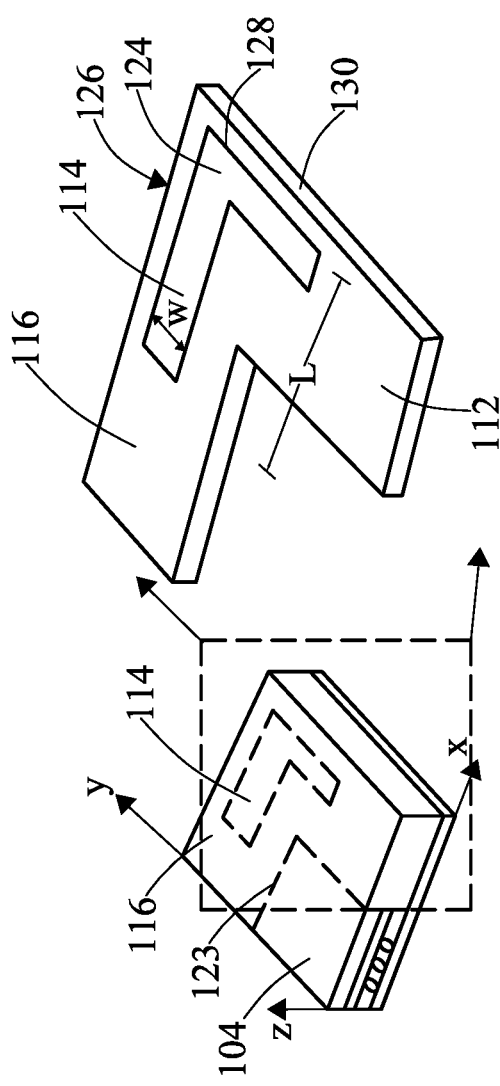
Fig. 1C
Fig. 1D
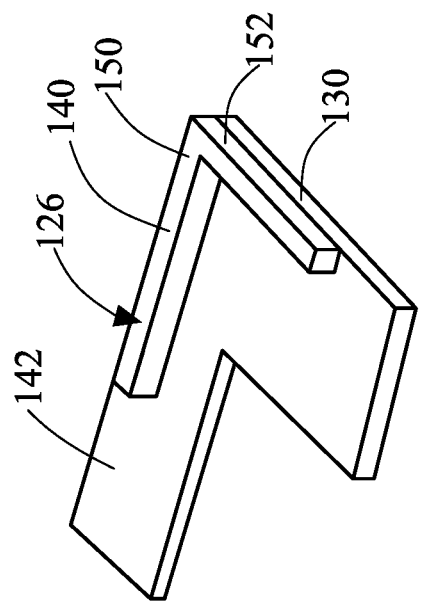
Fig. 2C
Fig. 2D

SEMICONDUCTOR DEVICE AND METHOD OF MANUFACTURE

PRIORITY CLAIM AND CROSS-REFERENCE

This application claims priority to and is a divisional of U.S. patent application Ser. No. 15/073,254, filed on Mar. 17, 2016 and entitled "Semiconductor Device and Method of Manufacture," which claims the benefit of U.S. Provisional Application No. 62/288,592, filed Jan. 29, 2016 and entitled "Semiconductor Device and Method of manufacture," which applications are incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing various insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components require smaller and more advanced packaging systems than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 1B illustrate various intermediary stages of manufacturing a device, in accordance with some embodiments.

FIG. 1C is a quarter-sectional view of the device illustrated in FIG. 1B shown in an isometric arrangement, in accordance with some embodiments.

FIG. 1D is a detailed, isometric view of a molding compound illustrated in the device of FIG. 1C, in accordance with some embodiments.

FIGS. 2A through 2B illustrate various intermediary stages of manufacturing a device, in accordance with some embodiments.

FIG. 2C is a quarter-sectional view of the device illustrated in FIG. 2B shown in an isometric arrangement, in accordance with some embodiments.

FIG. 2D is a detailed, isometric view of a molding compound illustrated in the device of FIG. 2C, in accordance with some embodiments.

DETAILED DESCRIPTION

Figure 3:
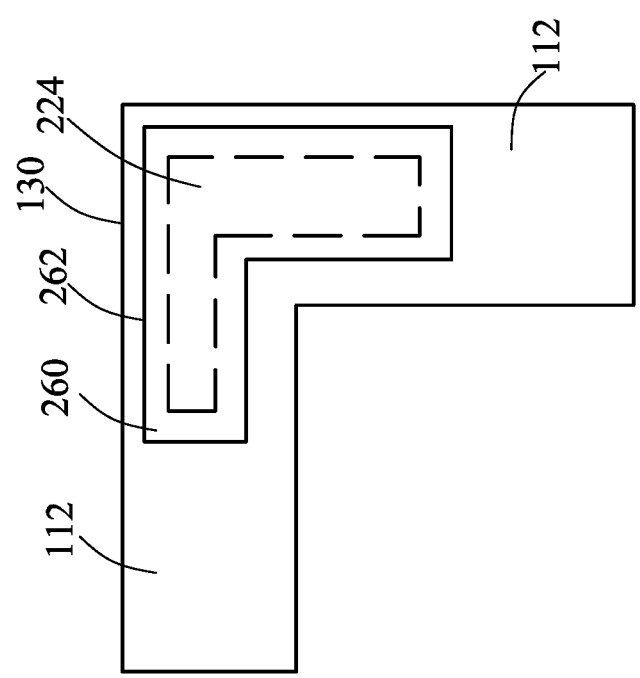
FIG. 3 is a top, quarter-section view of a molding compound, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A through 1D illustrate a semiconductor device or package 100 according to an illustrative embodiment. Referring now primarily to FIGS. 1A and 1B, the semiconductor device 100 is illustrated in cross-section, according to some embodiments, in intermediary stages of manufacturing. The semiconductor device 100 includes a substrate 102 and a device die 104 positioned over the substrate 102.

The substrate 102 may be a semiconductor substrate in some embodiments. The semiconductor substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices (not shown) such as transistors, capacitors, resistors, diodes, photo-diodes, fuses, and the like may be formed at the top side 103 of the substrate 102. An interconnect structure (not shown) may be formed over the active devices and the substrate 102. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, CVD, and plasma-enhanced CVD.

The interconnect structure electrically connects various active devices to form functional circuits. The functions provided by such circuits may include memory structures, processing structures, sensors, amplifiers, power distribution, input/output circuitry, or the like. The above examples are provided for illustrative purposes only to further explain applications of the present invention and are not meant to limit the present invention in any manner. Other circuitry may be used as appropriate for a given application.

Input/output (I/O) and passivation features (not separately illustrated) may be formed over the interconnect structure. For example, contact pads may be formed over the interconnect structure and may be electrically connected to the active devices through the various conductive features in the interconnect structure, and a passivation layer may be formed over the interconnect structure and the contact pads. Under bump metallurgies (UBMs) may be formed on such contact pads and connectors (e.g., BGA balls, C4 bumps, microbumps, combinations thereof, and the like) may be formed on the UBMs. Additionally, in embodiments where the device die 104 is a semiconductor die, connectors may be formed on a backside 105 of the substrate 102 (e.g., the side of the substrate 102 opposing a side having active devices formed thereon), and through vias may be formed in the substrate 102 to provide electrical connection between connectors and the interconnect structure of the device die 104.

The device die 104 has a first surface 106 and a second opposing surface 108. The first surface 106 of the device die 104 faces the substrate 102 such that the device die 104 is bonded (e.g., flip chip bonded) to a top side 103 of the substrate 102. In some embodiments, the device die 104 is bonded to contact pads (not shown) on the top side 103 of substrate 102 by a plurality of connectors 110, such as ball grid array (BGA) balls, controlled collapse chip connector (C4) bumps, microbumps, or the like. The device die 104 may be a semiconductor die and could be any type of integrated circuit, such as a processor, logic circuitry, memory, analog circuit, digital circuit, mixed signal, and the like. The device die 104 may include a substrate, active devices, and an interconnect structure (not individually illustrated).

Referring to FIGS. 1A through 1D, the semiconductor device 100 further includes a molding compound 112. The molding compound 112 is over the substrate 102 and surrounds the device die 104. In some embodiments, the molding compound 112 may be a molded underfill (MUF) comprising a polymer material (e.g., epoxy, a resin, and the like) either with or without hardeners, fillers (e.g., silica filler, glass filler, aluminum oxide, silicon oxide, and the like), adhesion promoters, combinations thereof, and the like.

The molding compound 112 may be formed using a suitable process, such as a transfer molding process. The substrate 102 and the device die 104 may be disposed between a top mold chase and a bottom mold chase in a molding apparatus. The top and bottom mold chases may comprise a suitable material for providing structural support/pressure. The top and/or bottom mold may be moved to cover features of the substrate 102 and/or the device die 104 during the molding process, which may prevent the formation of the molding compound 112 over such features of the substrate 102 and/or the device die 104. Protective films may be disposed between the mold chases and contact various features of the substrate 102 and/or device die 104. Protective films protect such features from damage due to contact with top or bottom chases. In some embodiments, protective films comprise rubber, polyethylene terephthalate (PET), teflon, or any other material that can be removed from the substrate 102 and/or the device die 104 after molding.

In another embodiment, the molding compound 112 may be initially formed to cover the device die 104. Next, a planarization step such as a Chemical Mechanical Polish (CMP) step or a grinding step is performed to planarize the molding compound 112 until the device die 104 is exposed. Due to the planarization, the top surface of the device die 104 is substantially level (coplanar) with the top surface of molding compound 112.

Referring still to FIGS. 1A through 1D, the molding compound 112 includes a structural interface 114. FIG. 1C is a quarter-sectional view of the semiconductor device 100 illustrated in FIG. 1B, shown in an isometric arrangement, with the structural interface 114 shown by hidden lines. FIG. 1D is a detailed, isometric view of FIG. 1C, illustrating the molding compound 112 with the structural interface 114 in accordance with some embodiments. In some aspects, the structural interface 114 is formed along an outer portion or peripheral region 116 of the molding compound 112. The outer portion or peripheral region 116 of the molding compound 112 is distal to an outer edge 123 of the device die 104.

In some aspects, the structural interface 114 is a groove 124 formed in the molding compound 112. In an embodiment, the groove 124 is broken into segments along the outer portion or peripheral region 116 of the molding compound 112. In another embodiment, the groove 124 is positioned in the outer portion or peripheral region 116 of the molding compound 112 but only in one or more corner regions 126 of the molding compound 112. The groove 124 may have a first leg extending along one side of the molding compound 112 and a second leg extending along and adjacent side of the molding compound 112. In some aspects, the first and second legs are perpendicular to each other. In yet some aspects, the groove 124 is L-shaped. In an alternative embodiment, the groove 124 is continuous, e.g., the groove 124 extends along the outer portion or peripheral region 116 of the molding compound 112 without interruption.

In an illustrative embodiment, an outer edge 128 of the groove 124 is approximately 850 micrometers (μm) from an outer edge 130 of the molding compound 112. In another illustrative embodiment, the outer edge 128 of the groove 124 is approximately 300 μm from the outer edge 130 of the molding compound 112. The outer edge 128 of the groove 124 may be approximately 300 μm to 850 μm from the outer edge 130 of the molding compound 112.

In some embodiments, the groove 124 has a width, W, of approximately 1 millimeters (mm). In yet some embodiments, the groove 124 has a width, W, of approximately 1 to 1.5 mm. In some other embodiments, the groove 124 has a length, L, of approximately 4 to 4.5 mm. In an embodiment, the groove 124 has a depth, D, of approximately 50 μm to 150 μm. The depth, D, extends from a topmost surface 132 of the molding compound 112 to a bottommost surface 134 of the groove 124. However, any suitable dimensions may be utilized.

The groove 124 may be formed by a laser ablation process that uses, for example, an EO Laser Ablation-BMC502PI offered by EO Technics Co, Ltd. having a laser power setting of approximately 3.7 W plus or minus 0.3 W. In an embodiment the laser ablation process may be performed by irradiating or ablating the molding compound 112 with a series of laser pulses to form the grooves 124.

In other embodiments, the groove 124 may be formed or patterned using a laser drill or a mold trace. In such a method, a protective layer, such as a light-to-heat conversion (LTHC) layer or a hogomax layer, is first deposited over the molding compound 112. Once protected, a laser is directed towards those portions of the molding compound 112 which are desired to be removed in order to form the groove 124. During the laser drilling process the drill energy may be in a range from 0.1 mJ to about 30 mJ and a drill angle of about 0 degree (perpendicular to the molding compound 112) to about 85 degrees to normal of the molding compound 112.

Referring primarily to FIGS. 1B and 1C, the semiconductor device 100 includes a thermal interface material 118 and may further include a lid 120. The thermal interface material 118 is positioned over the molding compound 112 and the second surface 108 at the device die 104. The thermal interface material 118 is used for thermal interconnection between the lid 120 and the device die 104. In some embodiments, the thermal interface material 118 is used to join the lid 120 to the device die 104. In yet some other embodiments, the thermal interface material 118 is used to join the lid 120 to the molding compound 112. In still some other embodiments, the thermal interface material 118 is used to join the lid 120 to the molding compound 112 and the device die 104.

The lid 120 is placed over and bonded to the device die 104 and/or the molding compound 112. The lid 120 may have a flat top surface. In some embodiments, the lid 120 may be formed of a homogeneous material throughout, which means all the parts of the lid 120 are formed of the same material. In an embodiment, the lid 120 is a metal lid. For example, the lid 120 may be made of copper (Cu) with a thin layer of nickel (Ni), although other metals or metal alloys such as aluminum or aluminum alloys may be used.

The thermal interface material 118 may be selectively deposited. In some embodiments, the thermal interface material 118 is selectively deposited over the device die 104. The thermal interface material 118, in an illustrative embodiment, is deposited over the device die 104 with the quantity of approximately 16 to 28 grams (g). In yet some embodiments, the grooves 124 act to catch excess thermal interface material 118 when the lid 120 is placed on the device die 104.

The thermal interface material 118 has a high thermal conductivity and adheres to both the lid 120 and the device die 104 and/or the molding compound 112. In some embodiments, the thermal interface material 118 is made of silicones, such as polymers including silken, carbon, hydrogen, oxygen and sometimes other elements. Alternatively, the thermal interface material 118 may also be made of other materials such as alumina ($Al_3O_3$) or zinc oxide ($ZnO_2$) mixed with silicone and other applicable materials.

In some embodiments, the thickness, T, of the thermal interface material 118 between the device die 104 and the lid 120 is in a range from about 10 micrometers (μm) to about 300 μm. In some embodiments, the thermal interface material 118 has a thermal conductivity, of between about 3 watts per meter kelvin (W/m·K) to about 5 W/m·K or more. Accordingly, the heat generated in the device die 104 may dissipate to the lid 120, and then dissipate to the external environment. Certain types of device dies generate a large amount of heat during operation. For example, device dies that include central processing unit (CPU), graphical processing unit (GPU), and/or field-programmable gate array (FPGA) tend to generate large amount of heat.

In operation, the chip or device die 104 is positioned over the substrate 102 and includes the connectors 110 to provide electrical connections for the device die 104. The device die 104 and the substrate 102 are placed in a mold. A molding process is performed in which the molding compound 112 is formed above the substrate 102 and around the device die 104. The molding process is operable to position the molding compound 112 in between voids 136, e.g., spaces between the connectors 110, and around the device die 104 to support the device die 104 and provide structural integrity. The substrate 102, the device die 104 and the molding compound 112 form the package structure 122. The package structure 122 is removed from the mold. After the package structure 122 has been removed from the mold the groove 124 is formed in the outer portion or peripheral region 116 of the molding compound 112. The thermal interface material 118 is then applied over the second surface 108 at the device die 104 and at least a portion of the molding compound 112 where the groove 124 is located, such that the thermal interface material 118 fills the groove 124. The lid 120 is then positioned over the thermal interface material 118 and bonded thereto.

The groove 124 helps prevent the thermal interface material 118 from bleeding or otherwise extending past the outer edge 130 of the molding compound 112. Bleeding of the thermal interface material 118 may cause warpage within the semiconductor device 100, which can create issues in yielding and contamination. The groove 124 acts to catch excess thermal interface material 118 when the lid 120 is placed on the device die 104.

Referring now to FIGS. 2A through 2D, a semiconductor device or package 200 according to another illustrative embodiment is presented. Similar to the embodiments described above with respect to FIGS. 1A through 1D, the semiconductor device 200 includes the substrate 102 and the device die 104 positioned over the substrate 102. The device die 104 is bonded to the top side 103 of the substrate 102. The first surface 106 of the device die 104 faces the substrate 102 and the device die 104 is electrically connected to the substrate 102 via the connectors 110.

The semiconductor device 200 further includes the molding compound 112 formed over the substrate 102 and surrounding the device die 104. The molding compound 112 includes the structural interface 114. FIG. 2C is a quarter-sectional view of the semiconductor device 200 illustrated in FIG. 2B shown in an isometric arrangement, with the structural interface 114 shown by hidden lines. FIG. 2D is a detailed, isometric view of FIG. 2C, illustrating the molding compound 112 with the structural interface 114 in accordance with some embodiments.

In some aspects, the structural interface 114 is formed along the outer portion or peripheral region 116 of the molding compound 112. The outer portion or peripheral region 116 of the molding compound 112 is distal to the outer edge 123 of the device die 104.

In some aspects, the structural interface 114 is a lip or dam 140 extending from a top surface 142 of the molding compound 112 along the outer region or peripheral region 116 of the molding compound 112. In some aspects, the lip or dam 140 extends along the outer edge 130 of the molding compound 112 such that the outer surface of the lip 140 is flush, or otherwise coplanar, with the outer edge 130 of the molding compound 112. In some aspects, the lip 140 is an integral part of the molding compound 112. In an embodiment, the mold is configured such that the lip 140 will be formed during the molding process such that the lip 140 is an integral part of the molding compound 112.

In another aspect, the molding compound 112 is reduced or planarized by, for example, grinding, CMP, etching, or another process to form the lip or dam 140. In some embodiments, the molding compound 112 may be formed to initially extend over and cover top surfaces of device die 104. The planarization process (e.g., a mechanical grinding, chemical mechanical polish (CMP), or other etch back technique) may be employed to remove portions of the molding compound 112 to form the lip or dam 140. In some embodiments, the planarization process (e.g., a mechanical grinding, chemical mechanical polish (CMP), or other etch back technique) may be employed to remove excess portions of the molding compound 112 over the device die 104 to expose the device die.

In an embodiment, the lip 140 extends continuously along the outer edge of the molding compound 112. In an alternative embodiment, the lip 140 is one of a plurality of lips each of which is positioned in the corner region 126 of the molding compound 112. In an embodiment, the lip 140 includes a first leg 150 and a second leg 152. In some embodiments, the lip 140 has a height, h, of between approximately 100 um and 200 um. In some embodiments, the lip 140 has a width, w, of between approximately 300 um and 350 um. And in some embodiments, the lip 140 has a length of between approximately 300 um and 350 um. The lip or dam 140 helps prevent the thermal interface material 118 from extending beyond the outer edge 130 of the molding compound 112.

The semiconductor device 200 further includes the thermal interface material 118 and the lid 120. The thermal interface material 118 is positioned over the molding compound 112 and the device die 104. The thermal interface material 118 joins the lid 120 to one or both of the molding compound 112 and the device die 104.

Referring to FIG. 3, another embodiment illustrating a second groove or a second trench 260 may be formed around the outer edge of a first groove 224, such as the groove 124 shown in FIGS. 1A through 1D, in the molding compound 112. In some embodiments, a perimeter of the first groove 224 is encircled by the second groove or the second trench 260. The second groove 260 may be formed in a separate step than the first groove 224. In one aspect, the second groove 260 is formed before the first groove 224. Yet in another aspect, the second groove 260 is formed after the first groove 224. The second groove 260 may have a depth of approximately 50 μm to 150 μm. In some embodiments, the second groove 260 is formed after the first groove 224 and merely extends the first groove 224 such that the second groove 260 becomes part of the first groove 224. The depth of the first groove 224 and the depth of the second groove 260 may be the same or different so long as the respective depths are between approximately 50 μm to 150 μm. In some aspects, the first groove 224 has a depth greater than the second groove 260. And yet, in alternative aspects, the second groove 260 has a depth greater than the first groove 224. For example, in an embodiment, the first groove 224 has a length, L, of approximately 4 mm, and the second groove 260 has a length of approximately 4 to 4.5 mm. In this embodiment, the first groove 224 may have a width, W, of approximately 1 mm, and the second groove 260 has a width of approximately 1 to 1.5 mm.

In an illustrative embodiment, an outer edge 262 of the second groove 260 is approximately 850 micrometers (μm) from the outer edge 130 of the molding compound 112. In another illustrative embodiment, the outer edge 262 of the second groove 260 is approximately 300 μm from the outer edge 130 of the molding compound 112. The outer edge 262 of the second groove 260 may be approximately 300 μm to 850 μm from the outer edge 130 of the molding compound 112.

Figure 4:
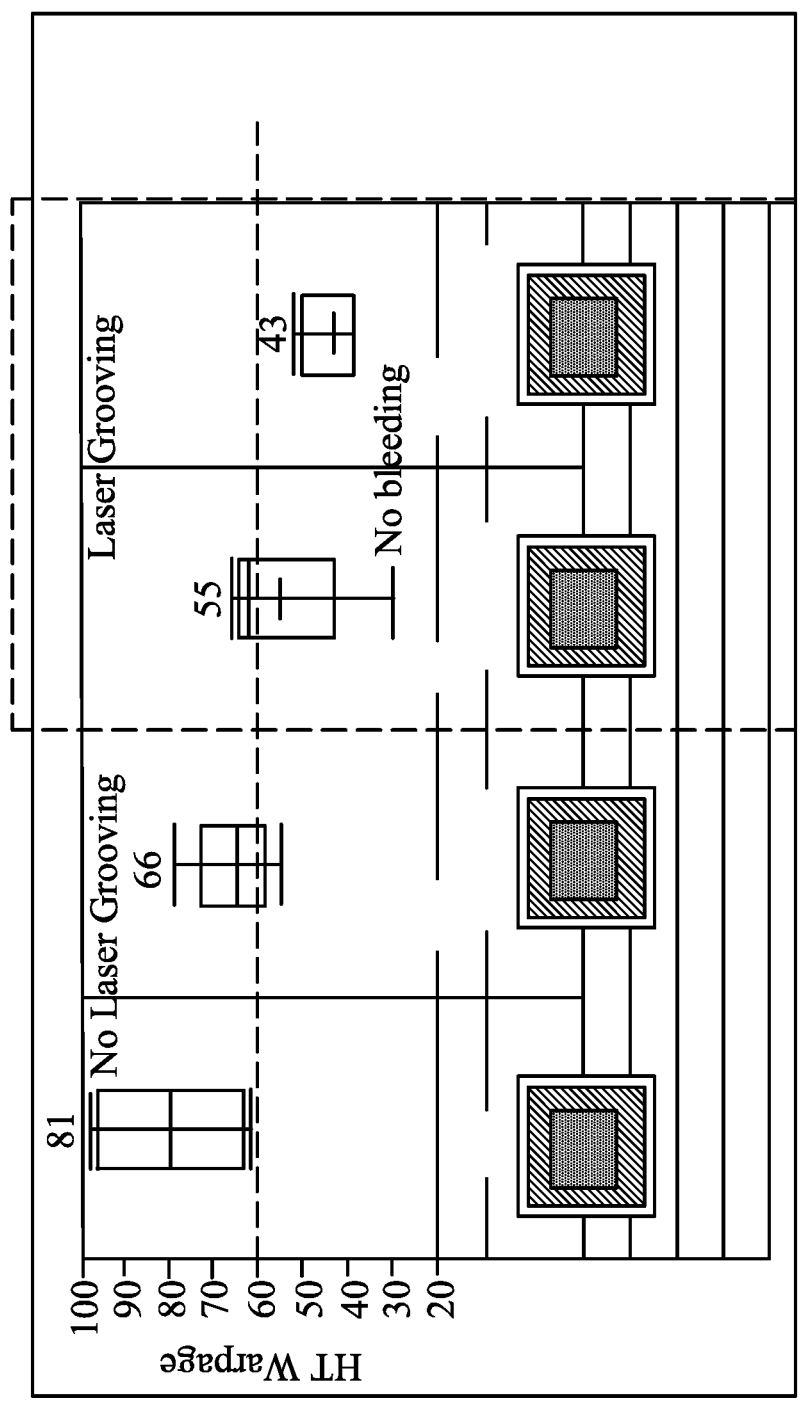
FIG. 4 is a box-plot graph illustrating experimental data.

Referring now to FIG. 4, experimental data is presented via a box-plot type graph. Experiments were conducted on four different packages. Each of the four different packages was subjected according to a high temperature warpage specification. In the high temperature warpage specification, each of the four different packages was heated to 260° C. and then allowed to cool. The amount of warpage, measured in micrometers, was then measured. It is desirable for the package warpage to be under 60 μm.

In experiment 1, the packages tested did not include grooves in the molding compound that surrounded the device die. A thermal interface material was deposited only over the device die such that no thermal interface material was deposited over the molding compound. The median warpage for these type packages was 81 μm, which is above the desired 60 μm threshold.

In experiment 2, the packages tested did not include grooves in the molding compound that surrounded the device die. The thermal interface material was deposited over the device die, the same as was deposited in experiment 1, and, additionally, over portions of the molding compound. The thermal interface material was deposited in an L-shaped over the molding compound in the four corners of the package. The median warpage for these types of packages was 66 μm, which is above the 60 μm threshold.

In experiment 3, the packages tested included a groove formed in the four corners of the package. The groove had two perpendicular legs extending partially along a respective edge of the package. The clearance between the outer edge of the package, which in this case is the outer edge of the molding compound, and an outer edge of the groove was approximately 850 μm. Each leg had a width of approximately 1 mm, a length of approximately 4 mm and a depth of approximately 100 μm. The thermal interface material was deposited over the device die and over each of the grooves in the same manner as it was deposited in experiment 2. The median warpage for these types of packages was 55 μm, which is within the desired 60 μm threshold.

In experiment 4, the packages tested included a groove formed in the four corners of the package. The groove had two perpendicular legs extending partially along a respective edge of the package. The clearance between outer edge of the package, which in this case is the outer edge of the molding compound, and an outer edge of the groove was approximately 300 μm. Each leg had a width of approximately 1 μm, a length of approximately 4 mm and a depth of approximately 100 μm. The thermal interface material was deposited over the device die in over each of the grooves in the same manner as it was deposited in experiments 2 and 3. The median warpage for these types of packages was 43 μm, which is within the desired 60 μm threshold.

It is desirable for a packages warpage to be less than 60 μm as specifications often require the warpage to be less than 60 μm. Additionally, it is also desirable to prevent the thermal interface material, which is sometimes used to combat warpage, from bleeding or otherwise extending beyond the outer edge of the package, which in some instances is the outer edge of the molding compound. Thermal interface material bleeding from package edge can create issues with yielding, contamination and warpage control.

In an embodiment, a device includes a substrate with a die over the substrate. A molding compound surrounds the die and includes a structural interface formed along a peripheral region of the molding compound.

In an embodiment, a device includes a substrate and a chip over the substrate. A molding compound surrounds the chip. The molding compound includes a peripheral region distal to the chip with a groove formed in the peripheral region of the molding compound.

In an embodiment, a method includes the steps of positioning a die over a substrate, forming a molding compound around the die, and forming a groove in a peripheral region of the molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   positioning a die over a substrate;
   forming a molding compound around the die, the molding compound having a first width, the first width being measured between a first peripheral edge of the molding compound and a second peripheral edge of the molding compound opposite the first peripheral edge;
   forming a groove in a peripheral region of the molding compound, the groove having a first distance measured between a first peripheral edge of the groove closest to the first peripheral edge of the molding compound and a second peripheral edge of the groove closest to the second peripheral edge of the molding compound; and
   forming a thermal interface material over the molding compound, the thermal interface material having a second width, the second width being measured between a first peripheral sidewall of the thermal interface material and a second peripheral sidewall of the thermal interface material opposite the first peripheral sidewall, the second width being smaller than the first width; and
   positioning a lid over the thermal interface material, the lid having a third width, the third width being the same as the first distance.

2. The method of claim 1 wherein the thermal interface material fills the groove.

3. The method of claim 1, wherein the groove is formed using a laser.

4. The method of claim 1, wherein the groove prevents the thermal interface material from extending beyond an outer edge of the molding compound.

5. The method of claim 1, wherein the third width is the same as the second width.

6. The method of claim 1, wherein the groove has a fourth width measured between a first interior edge of the groove closest to the first peripheral edge of the molding compound and a second interior edge of the groove closest to the second peripheral edge of the molding compound, wherein the die has a fifth width measured between a first peripheral edge of the die and a second peripheral edge of the die, the fourth width being less than the first distance and greater than the fifth width.

7. The method of claim 1, wherein the groove comprises a plurality of L-shaped segments.

8. A method comprising:
   bonding a chip to a substrate;
   forming a molding compound around the chip;
   planarizing the molding compound and the chip;
   forming a groove in the molding compound, the groove being defined by an outer sidewall proximate an outermost edge of the molding compound and an inner sidewall distal the outermost edge of the molding compound, the inner sidewall encircling a periphery of the chip; and
   filling the groove with a thermal interface material, the thermal interface material contacting the chip, wherein an outermost periphery of the thermal interface material is disposed within an outermost periphery of the molding compound.

9. The method of claim 8, wherein the chip is bonded to the substrate by flip chip bonding.

10. The method of claim 8, wherein the molding compound is formed using a transfer molding process.

11. The method of claim 8, wherein the molding compound and the chip are planarized before forming the groove in the molding compound.

12. The method of claim 8, wherein the groove is formed by laser ablation.

13. The method of claim 8, further comprising:
   depositing a protective layer over the molding compound; and
   forming the groove using laser drilling through the protective layer.

14. The method of claim 8, wherein the groove has a depth of between 50 μm and 150 μm and a width between the outer sidewall and the inner sidewall of between 1 mm and 1.5 mm.

15. A method comprising:
   mounting an integrated circuit chip on a substrate;
   forming a molding compound encapsulating sidewalls of the integrated circuit chip;
   forming a first trench in the molding compound, the first trench surrounding a peripheral portion of the integrated circuit chip;
   forming a second trench surrounding the first trench, the second trench having a depth different from the first trench;
   depositing an interface material over the molding compound, the interface material filling the first trench; and
   bonding a lid to the interface material, the lid having a first width in a first direction, the molding compound having a second width in the first direction, the second width being greater than the first width.

16. The method of claim 15, wherein the second trench is formed before the first trench.

17. The method of claim 15, wherein the first trench is formed before the second trench.

18. The method of claim 15, wherein the first trench and the second trench are L-shaped.

19. The method of claim 15, wherein the second trench is formed directly adjacent to the first trench.

20. The method of claim 15, wherein the first trench has a third width between a first peripheral edge of the first trench and a second peripheral edge of the first trench, the third width being the same as the first width.

\* \* \* \* \*